United States Patent [19]

Kreiger et al.

[11] Patent Number: 5,210,485
[45] Date of Patent: May 11, 1993

[54] PROBE FOR WAFER BURN-IN TEST SYSTEM

[75] Inventors: Walter C. Kreiger, Underhill; Donald L. Wilder, South Hero, both of Vt.

[73] Assignee: International Business Machines Corporation, Armonk, N.Y.

[21] Appl. No.: 736,899

[22] Filed: Jul. 26, 1991

[51] Int. Cl.⁵ .............................................. G01R 1/04
[52] U.S. Cl. ................................ 324/158 P; 324/72.5; 324/158 F; 29/846
[58] Field of Search ................ 324/158 P, 158 F, 725; 219/209, 210; 29/846

[56] References Cited

U.S. PATENT DOCUMENTS

| | | | |
|---|---|---|---|
| 3,986,082 | 10/1976 | Land | 219/210 |
| 4,356,379 | 10/1982 | Graeme | 219/209 |
| 4,374,316 | 2/1983 | Inamori et al. | 219/209 |
| 4,544,888 | 10/1985 | Kvaternik | 324/158 F |
| 4,686,464 | 8/1987 | Elsasser et al. | 324/158 |
| 4,766,371 | 8/1988 | Moriya | 324/158 F |
| 4,777,434 | 10/1988 | Miller et al. | 219/209 |
| 4,901,013 | 2/1990 | Benedetto et al. | 324/158 |
| 4,994,735 | 2/1991 | Leedy | 324/158 P |
| 4,998,062 | 3/1991 | Ikeda | 324/158 F |
| 5,034,685 | 7/1991 | Leedy | 324/158 P |
| 5,049,813 | 9/1991 | Van Loan et al. | 324/158 P |
| 5,055,780 | 10/1991 | Takagi et al. | 324/72.5 |
| 5,072,116 | 12/1991 | Kawade et al. | 73/105 |
| 5,079,501 | 1/1992 | Miller et al. | 324/158 P |
| 5,086,269 | 2/1992 | Nobi | 324/158 F |

OTHER PUBLICATIONS

"Buckling Direction Control in High-Density Contactors," IBM Technical Bulletin vol. 15, No. 11, Apr. 1973.
"New Alloy for Device Metal Masks or Silicon Masks," IBM Technical Bulletin vol. 27, No. 3, Aug. 1984.

Primary Examiner—Ernest F. Karlsen
Assistant Examiner—William J. Burns
Attorney, Agent, or Firm—Calfee, Halter & Griswold

[57] ABSTRACT

A test apparatus for testing electronic integrated circuitry, a test probe assembly for use in the apparatus, and a method of forming the test probe assembly are provided. The test apparatus subjects electronic integrated circuitry under test to changing temperatures while communicating test signals from external test equipment to the circuitry under test and back to the test equipment. The test probe assembly used in the apparatus is adapted to expand and contract along with the electronic integrated circuitry as the probe assembly and the integrated circuitry are heated and subsequently allowed to cool during testing, thereby maintaining precise alignment of probes on the probe assembly with test contact points on the electronic integrated circuitry. The probe assembly comprises a device interface board which is attachable to the external test equipment, a probe alignment device having an array of holes therein, and a plurality of probes attached at one end to the device interface board and extending through said array of holes. The probe alignment device comprises upper and lower guide elements separated by at least one spacer. The upper and lower guide elements each comprise a layer of electrically insulating, photolithographically patternable material attached and adjacent to a layer of silicon.

24 Claims, 8 Drawing Sheets

PROBE FOR WAFER BURN-IN TEST SYSTEM

FIELD OF THE INVENTION

The present invention relates generally to electronic integrated circuit testing devices, and more specifically to a multi-element probe for use in a wafer burn-in test system.

BACKGROUND

Electronic integrated circuitry is often tested under simulated normal operating conditions after manufacture in order to identify circuit defects. The circuitry may be subjected to more stressful conditions, such as operating the circuit in a heated environment, in order to exaggerate the failure rate of defective circuitry while ensuring greater reliability of the circuitry which survives the environmentally stressful conditions. Because the rate of electronic component failure is significantly higher during the early life of a component (the so-called infant mortality rate), testing under environmentally stressful conditions is an effective method of identifying integrated circuits which would likely experience early failure in the field.

In recent years, electronic integrated circuits have become increasingly smaller and more densely packed onto circuit cards or carrier modules. This increased density of circuits has limited the space available on the cards or modules for circuit interconnection elements. The advent of flip-chip technology has partially alleviated the space problem by permitting designers to eliminate pin packages for the integrated circuits and the associated pin interconnection elements. Using flip-chip technology, an integrated circuit chip cut from a wafer may be directly attached to interconnection points such as solder pads on the card or module, by means of a solder reflow process which forms an electrically conductive junction between the integrated circuit chip and circuit lines on the card or module.

Environmental testing of integrated circuits used in flip-chip technology presents a problem not encountered with testing integrated circuits encapsulated in pin packages. Pin packaged integrated circuits may be tested while being temporarily mounted onto test cards having sockets for the pins. Temporary mounting of integrated circuits used in flip-chip processes, however, is not an acceptable alternative. Temporary mounting requires subjecting the integrated circuit chip to a first solder reflow process to attach the integrated circuit to the carrier prior to testing, and a second solder reflow process to detach the chip upon completion of the test. This second solder reflow process is particularly undesirable in that it subjects the integrated circuit chip to heat and excessive handling after the testing has been completed. Any damage caused to the chip during removal of the chip from the carrier will be undetectable, resulting in defective integrated circuits which are determined to be acceptable.

Thus there is a need to be able to test integrated circuits used in flip-chip technology without temporarily mounting the circuit chips on a carrier module. This need is further demonstrated by the fact that circuit card or carrier module manufacturers often purchase integrated circuit chips to be used on the cards or modules from outside sources, thereby precluding any possibility of testing the integrated circuits while mounted on their intended cards or modules.

Due to the miniaturization of integrated circuit technology, handling and testing of individual integrated circuit chips is difficult. Environmental testing is thus best accomplished while the individual circuits reside on their respective wafers. Such a method of testing, however, presents its own problem due to spatial limitations. Each of the integrated circuits on the wafer has contact points on the surface of the wafer which must be contacted by a particular element of a multi-element test probe. The diminutive size of the test contact points requires that the elements of the test probe be of an appropriately small size, and further that the test probe elements be precisely aligned with the test contact points on the integrated circuits undergoing the test.

The precise alignment between the elements of the test probe and the test contact points on the integrated circuits is difficult to maintain over the temperature range utilized during environmental testing (e.g. burn-in testing). For example, heating the wafer, which is comprised of silicon, results in a minor expansion of the wafer due to the thermal expansion coefficient of silicon. Even this minor expansion, however, can cause problems due to the diminutive size of the test contact points on the integrated circuits on the wafer. As a result, the elements of the test probe may become misaligned with respect to these test contact points to such an extent that the probe elements no longer contact the test contact points. Maintaining alignment is of critical importance in most aspects of testing, e.g. preventing self-healing of some types of integrated circuit faults during cool down, maintaining contact during temperature step stress, maintaining contact during power step stress, or any changes in temperature or power with electrical contact required.

The problem may be solved if the multi-element probe is selected to possess the same or similar thermal expansion coefficient as that of silicon. Because it is desirable to construct the probe elements from a conductive metal, other portions of the test probe assembly must be selected so that, generally, the thermal expansion coefficient of the test probe assembly matches that of the silicon wafer. At the same time, the test probe assembly must provide means to effectively and accurately position the probe elements so that proper initial contact may be made with the test contact points on the integrated circuits being tested. The present invention provides a test apparatus having such a probe assembly, as well as a method of constructing the probe assembly.

SUMMARY OF THE INVENTION

The present invention provides a test apparatus for testing electronic integrated circuitry, a test probe assembly for use in the apparatus, and a method of forming the test probe assembly. The test apparatus subjects electronic integrated circuitry to changing temperatures while communicating test signals from external test equipment to the circuitry under test and back to the test equipment. The test probe assembly used in the apparatus is adapted to expand and contract along with the electronic integrated circuitry as the probe assembly and the integrated circuitry are heated during testing, thereby maintaining precise alignment of the probes with test contact points on the electronic integrated circuitry.

The test apparatus provides means to initially align the test probe assembly with test contact points on a test wafer, means to adjust and verify this alignment, and means to heat the wafer during the test. In addition, the test probe assembly provides means to maintain the precise alignment of probes on the test probe assembly with the contact points on the test wafer notwithstanding expansion of the wafer during the test caused by the application of heat. Maintenance of this precise alignment is made possible by constructing portions of the probe assembly and the heating means from materials which have a thermal coefficient of expansion similar to that of the test wafer material.

Specifically, a major portion of the heating means is constructed of a silicon substrate. The heating means is adapted to evenly heat individual integrated circuits on the test wafer, having a generally planar surface which contacts the generally planar surface of the test wafer. The heating means comprises a plurality of electrically conductive serpentine traces etched onto the silicon substrate. The heating means can also be provided with a plurality of sensors for controlling the application of heat.

The test probe assembly is also constructed from materials having a thermal coefficient of expansion similar to that of the test wafer. Specifically, the test probe assembly comprises a silicon device interface board, upper and lower guide elements attached to and separated by spacers, and a plurality of probes attached to the device interface board and extending through the upper and lower guide elements. Each of the upper and lower guide elements is comprised of a layer of silicon having an array of holes etched therein, attached to a layer of electrically insulating, photolithographically patternable material having a corresponding array of holes etched therein.

DETAILED DESCRIPTION OF THE PREFERRED EMBODIMENT

Figure 1:
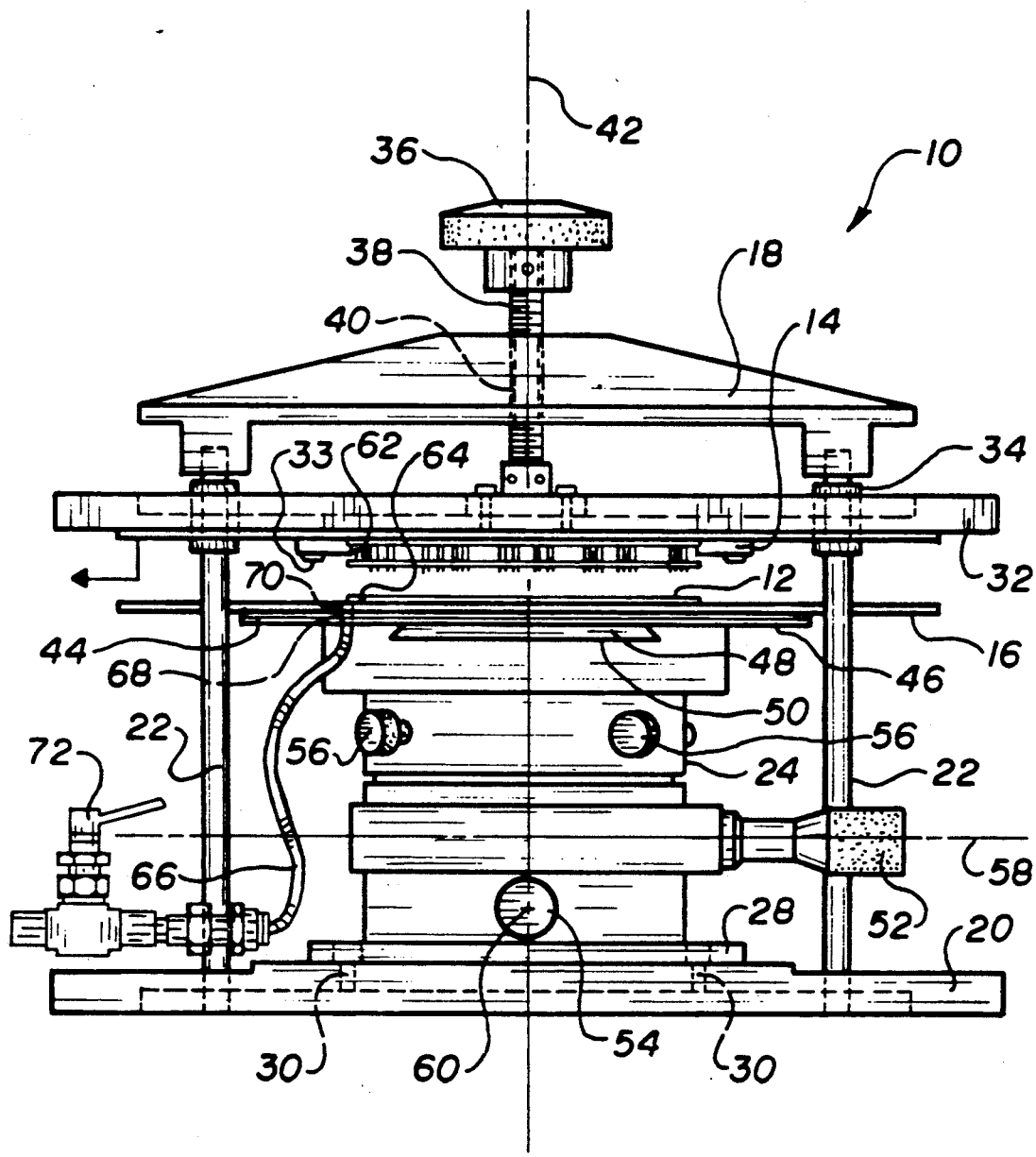
FIG. 1 is a side elevational view of a test apparatus constructed according to the principles of the present invention.

Referring now to the drawings, a test apparatus having a test probe assembly constructed according to the principles of the present invention is shown.

Figure 2:
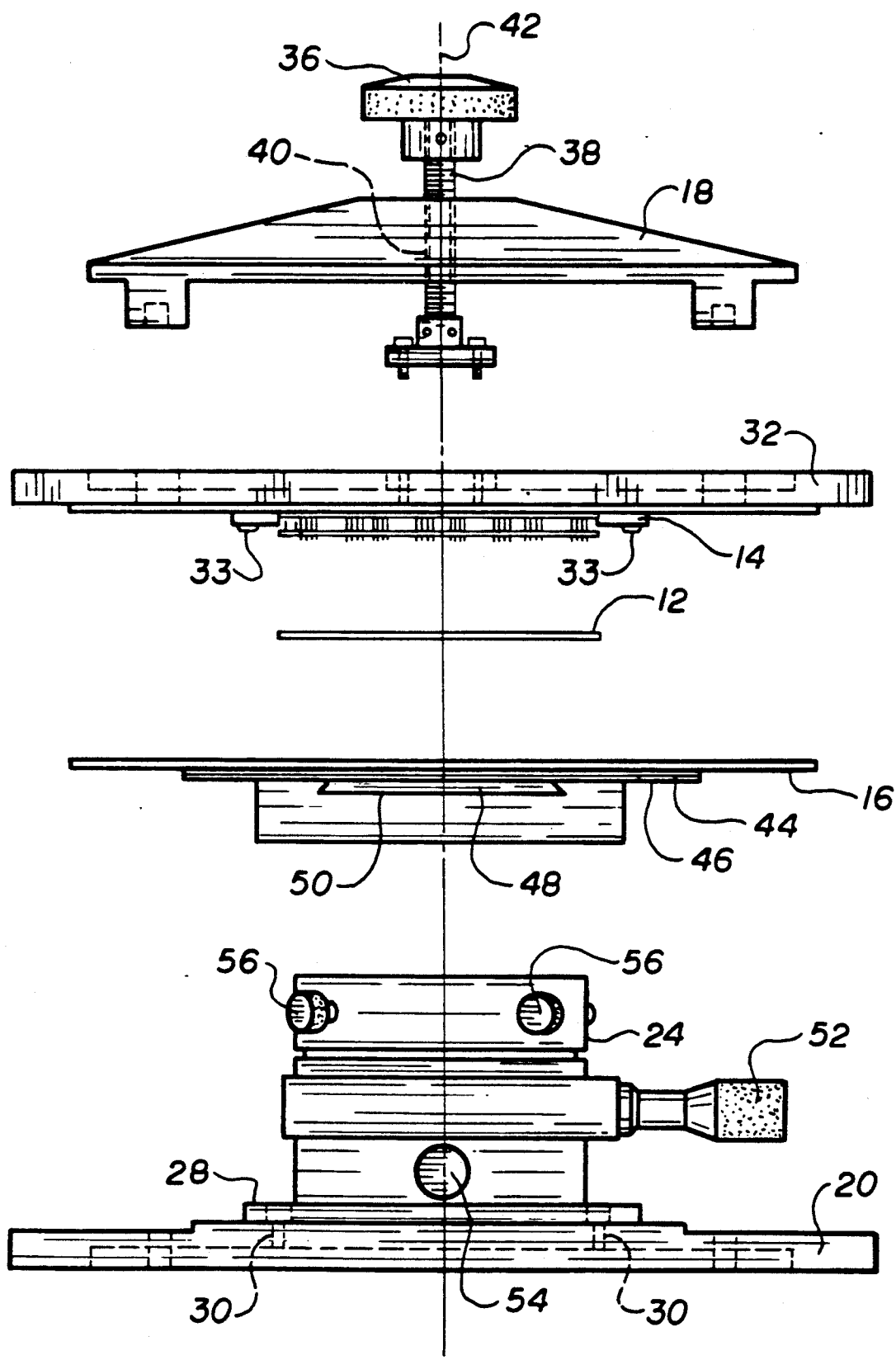
FIG. 2 is an exploded view of the apparatus of FIG. 1.

As shown in FIGS. 1 and 2, a test apparatus referred to generally at 10 provides means to transmit test signals from external test equipment to a plurality of integrated circuits residing on a test wafer 12, and from the integrated circuits back to the test equipment. The apparatus further provides means to precisely align a test probe assembly 14 with contacts on the test wafer 12, a heater element 16 for applying heat to the test wafer during test, and means to maintain the precision alignment of the test probe assembly with the contacts on the test wafer 12 notwithstanding expansion of the test wafer during testing due to the application of heat. The test equipment provides circuitry to verify electrical contact of each probe in the probe assembly with a contact on the test wafer.

The test apparatus 10 comprises a head 18 which is fixedly attached to a lower chuck 20 by means of precision guide rails 22 which maintain the head 18 spaced apart from and in fixed relationship to the lower chuck 20. Mounted to the lower chuck 20 is a precision adjustable stage 24 onto which the test wafer is removably mounted for testing. The adjustable stage 24 has a base 28 which is fixedly mounted to the lower chuck 20 by means of fasteners such as bolts 30.

An upper chuck 32 having the test probe assembly 14 attached thereto by means of screws 33 is slidably mounted on the precision guide rails 22 by means of bearing collars 34. The upper chuck 32, and hence the test probe assembly, is movable toward and away from the stage 24 along the guide rails 22 by means of a precision adjustable thumb screw 36 having a threaded shaft 38 which is fixedly attached to the upper chuck 32. The threads on the shaft 38 mate with a threaded hole 40 drilled into the head 18 of the test apparatus. By manually turning the thumb screw 36, the position of the test probe assembly can be changed with respect to the test wafer, removably mounted to the stage 24, along an axis 42 which corresponds to the longitudinal axis of the shaft 38 of the thumb screw 36. This axis is hereinafter referred to as Z-axis 42.

The precision adjustable stage 24 also provides means to adjust the position of the test probe assembly 14 with respect to the test wafer 12 removably mounted to the stage, in directions other than the Z-axis 42. The stage 24 includes a platform 46 which has a beveled portion 48 slidably mounted in a beveled groove 50 in the stage. In the preferred embodiment, the platform 46 is provided with a pressure sensing device 44 which both senses the pressure at which the test probe assembly contacts the test wafer 12 along the Z-axis, and provides a visual indication of the level of this sensed pressure. Fixedly mounted to the platform 46 of the stage 24 is the heater element 16 to which the test wafer 12 is removably attached. The heater element 16 and the platform 46, therefore, are slidably movable together as a unit along groove 50 away from the remainder of the stage 24 and toward an operator using the apparatus. This slidable movement permits easy installation and removal of the test wafer 12 from the apparatus.

Precision adjustment of the test wafer attached to the heater element, with respect to the test probe assembly attached to the upper chuck 32, and in directions other than those along the Z-axis 42, is accomplished by means of precision adjustment screws 52, 54 and 56 in the stage 24. Precision screw 52 permits precise adjustment of the position of the test wafer along an X-axis 58 which extends between the precision guide rails 22 and is perpendicular to the Z-axis 42. Precision screw 54 permits precise adjustment of the test wafer position along a Y-axis 60 which is perpendicular to both the X-axis 58 and the Z-axis 42. Means are also provided to adjust the angular position of the test wafer, which is located in the X-Y plane, with respect to the Z-axis 42. These means comprise angular precision screws 56 which permit a precise rotational alignment of the platform 24 with respect to the upper chuck 32, which is also located in the X-Y plane, with the test wafer.

In the preferred embodiment of the present invention, means are provided for verifying the precise alignment of the test probe assembly 14 with respect to the test wafer. These means comprise a conventional optical source 62 located on the test probe assembly for directing a beam of light toward the surface of the test wafer. Precise alignment is verified when the beam of light shines upon an indicator mark 64 located on the surface of the test wafer.

Also in the preferred embodiment, means are provided for fixing the position of the test wafer 12 with respect to the heater element. These means comprise a vacuum line 66 which is attached at one end to a hole 68 through the platform 46 which communicates with a hole 70 through the heater element, and at the other end to a valve 72 which is connectable to a source of negative pressure. A test wafer residing on the heater element so as to cover the hole 70 is thus drawn toward the heater element by the vacuum. In this manner, the position of the test wafer 12 with respect to the heater element 16 may be fixed while the wafer is being tested.

Thus, an operator using the apparatus 10 is provided with sufficient means to align the test probe assembly 14 attached to the upper chuck 32 with the test wafer 12 removably attached to the heater element 16 prior to beginning the test. The heater element 16 and the platform 46 are slidable as a unit toward the operator to facilitate installation of the test wafer, and then back toward the apparatus to its original position. The valve 72 is opened, thereby creating the vacuum necessary to secure the test wafer to the heater element. The test probe assembly is then aligned with the wafer using precision adjustment screws 52, 54 and 56. Once the adjustments are verified using the optical source 62 and the indicator mark 64, the operator turns the adjustable thumb screw 36 to enable contact between the test wafer and the probe assembly, until the pressure sensing device 44 reads the appropriate level of pressure. The wafer is then correctly positioned for testing.

In addition to providing means to precisely align the probe assembly 14 with the test wafer 12, the present invention also provides means to maintain this precise alignment notwithstanding the expansion of the test wafer during testing due to the application of heat by the heater element 16. Maintenance of precise alignment during test is made possible by (i) constructing portions of the probe assembly and the heater element from materials which have a thermal expansion coefficient similar to that of the test wafer material and (ii) constructing other portions of the probe assembly from a photolithographically patternable material into which a precise array of alignment holes may be etched.

Specifically, the test wafer is comprised substantially of a silicon substrate. A major portion of the heater element and a portion of the probe assembly are also constructed from silicon (thermal expansion coefficient of 2.6 ppm per degree Centigrade). The silicon used to construct portions of the heater element and the test probe assembly is preferably obtained from similar batch processing as that used to produce the test wafer, thereby ensuring even greater thermal expansion compatibility of the wafer, the heater element, and the test probe assembly.

Other portions of the probe assembly are constructed from FOTOFORM. FOTOFORM is a trade name of Corning Glass Co. of Corning, N.Y., for a high aspect ratio etchable, electrically insulating, photolithographically patternable material. An important characteristic of FOTOFORM is that holes may be accurately etched therein of precisely controllable size, shape and location.

Figure 3:
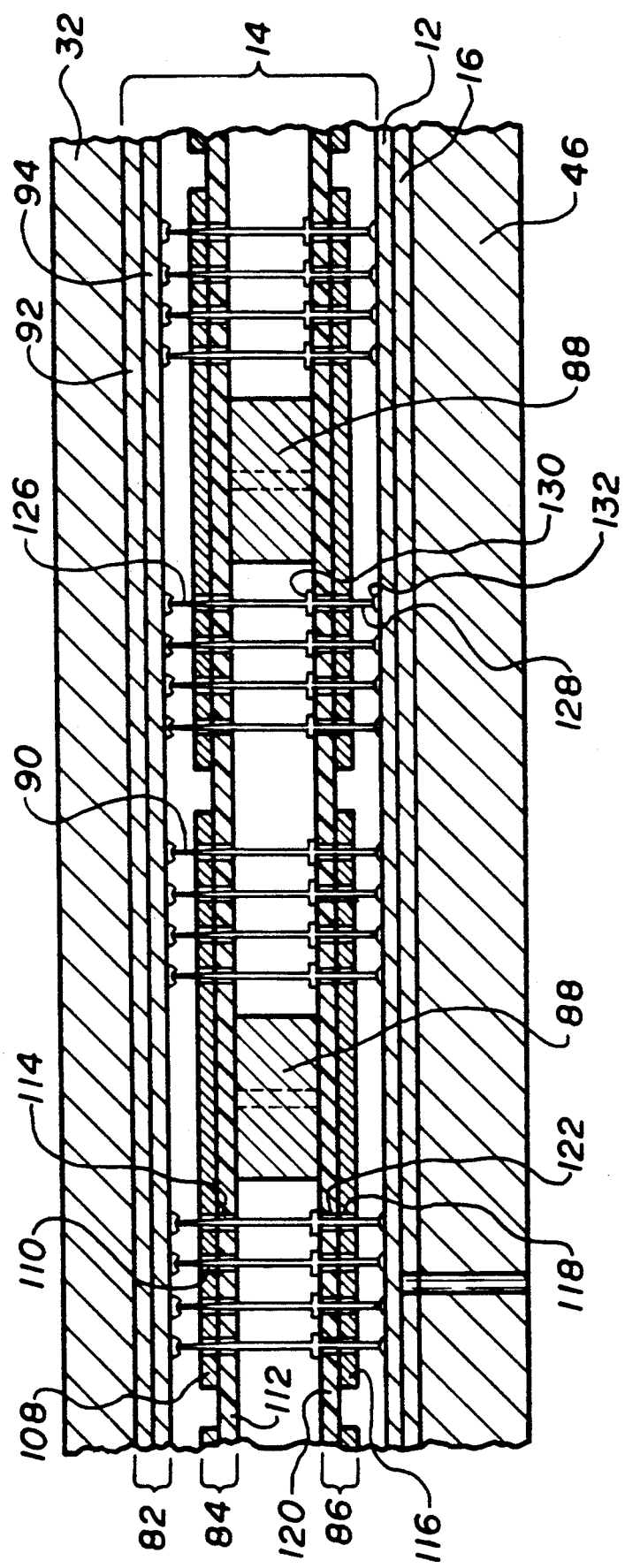
FIG. 3 is a partial sectional view of the test probe assembly used with the apparatus of FIG. 1.

FIG. 3 illustrates a cross section of a test wafer 12 intermediate and contacting the heater element 16 and the test probe assembly 14. The test probe assembly 14 is shown attached to the upper chuck 32 of the apparatus. The heater element is shown attached to the platform 46 of stage 24.

Figure 4:
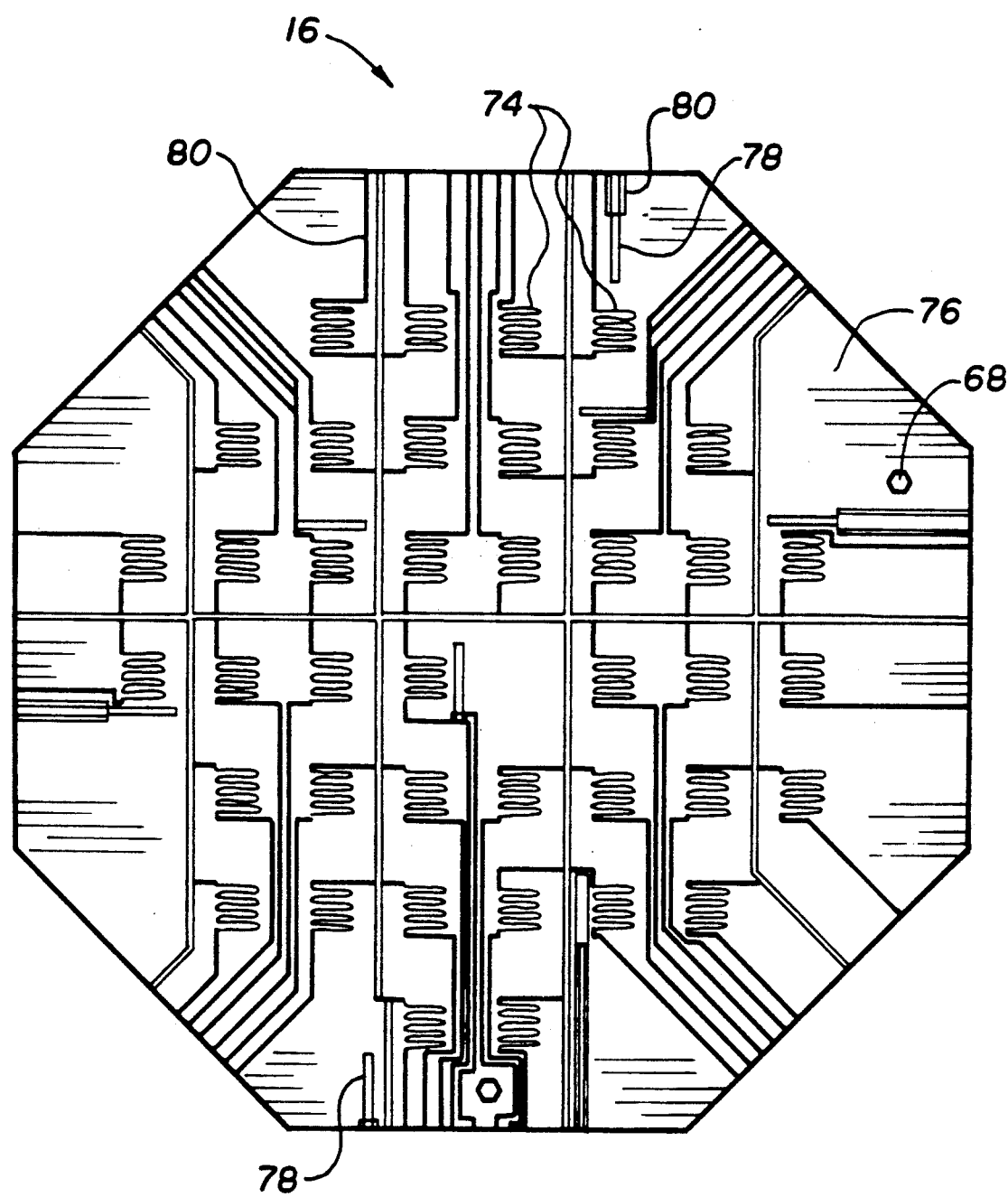
FIG. 4 is elevational view of the heater element used with the test probe assembly of FIG. 1.

The heater element is adapted to evenly heat individual integrated circuits on the test wafer, having a generally planar surface which contacts the generally planar surface of the test wafer over a large area. As shown in FIG. 4, the surface of the heater element 16 is octagonal in shape, roughly approximating and circumscribing the circular shape of the test wafer. The heater element comprises a plurality of electrically conductive serpentine traces 74 etched onto a silicon substrate 76. Preferably, the traces 74 are made of aluminum which is blanket deposited onto the surface of the substrate 76 and then etched by conventional processes. As shown in FIG. 4, forty serpentine traces are etched onto the substrate in a particular pattern. The number of serpentine traces corresponds to the number of integrated circuit chips on the test wafer. The pattern shown in FIG. 4 corresponds to a similar pattern of forty integrated circuits located on the surface of the test wafer. Using this pattern of serpentine traces permits even, controlled heating of the individual integrated circuits on the test wafer, often at temperatures up to 180° C.

The even, controlled heating of the individual integrated circuits may be monitored by a plurality of sensors 78 which are also etched onto the surface of the silicon substrate 76 in a conventional manner. The sensors are connectable to an external controller to control the application of electrical current to the serpentine traces 74. Aluminum traces 80 are also similarly etched onto the surface of the silicon substrate to carry electrical current to the serpentine traces 74 and connect the sensors 78 to the outside controller.

Referring back to FIG. 3, the test probe assembly 14 is shown contacting a test wafer residing on the heater element 16. The test probe comprises an interconnection device 82 which is connectable to the external test equipment, upper and lower guide elements 84 and 86, respectively, attached to and separated by spacers 88, and a plurality of probes 90 attached to the interconnection device and extending through the upper and lower guide elements.

The interconnection device 82 provides means to connect the plurality of probes 90 with the external test equipment to supply the probes with electrical test signals. The device 82 comprises a printed circuit board 92 which is attached to a device interface board 94. The printed circuit board 92 has a plurality of copper foil lines etched thereon, each of which is broad enough at one end to permit the external test equipment connections, and significantly narrower at the other end. The narrowed ends of the copper foil lines match a pattern of traces on the device interface board 94. The printed circuit board 92 is attached to the device interface board by wire bonding the traces on the device interface board with the narrowed ends of the copper foil lines on the printed circuit board, thereby forming the interconnection device 82.

Figure 5:
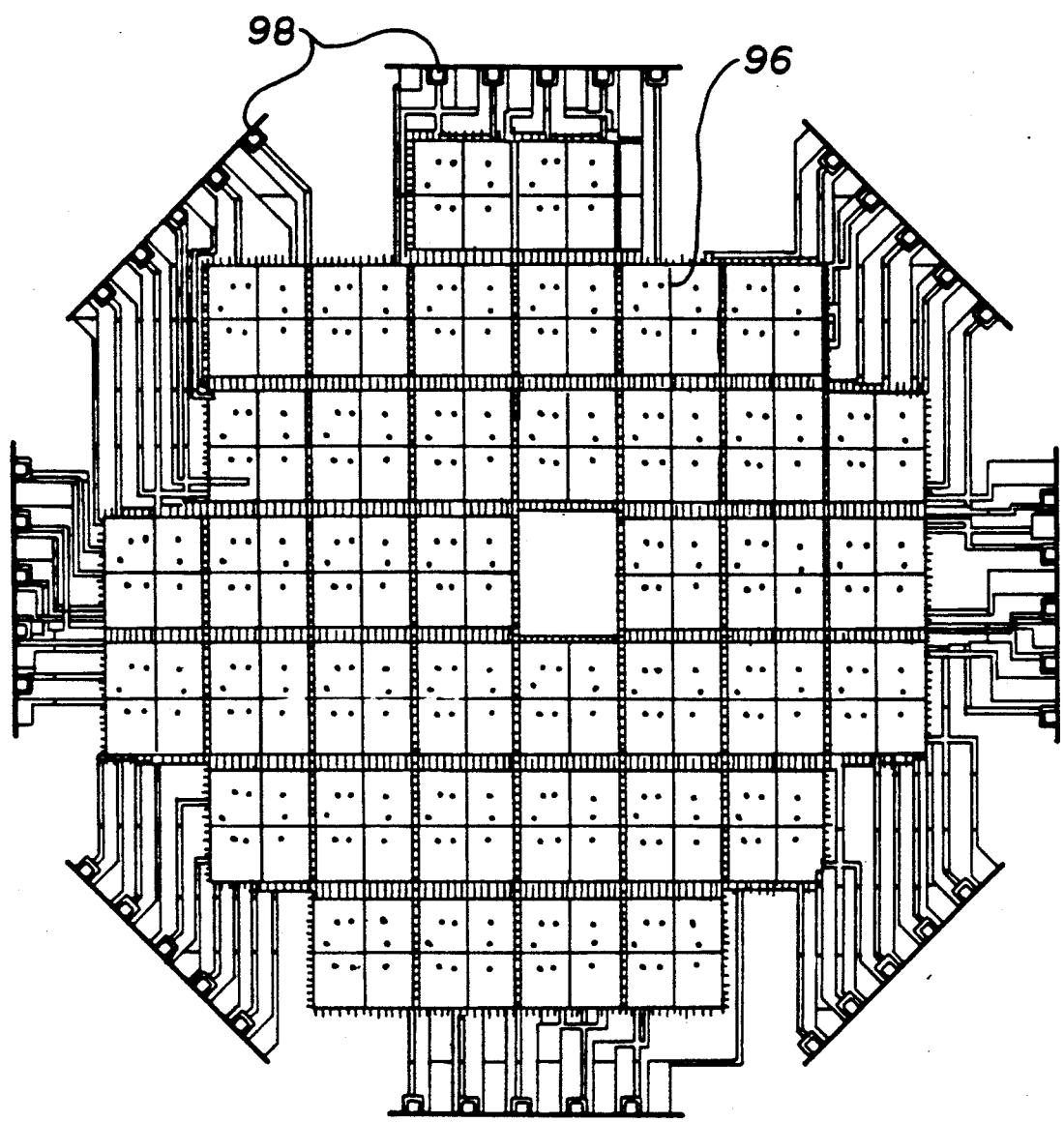
FIG. 5 is an elevational view of the first level of etching on the device interface board used with the test probe assembly of FIG. 3.
Figure 6:
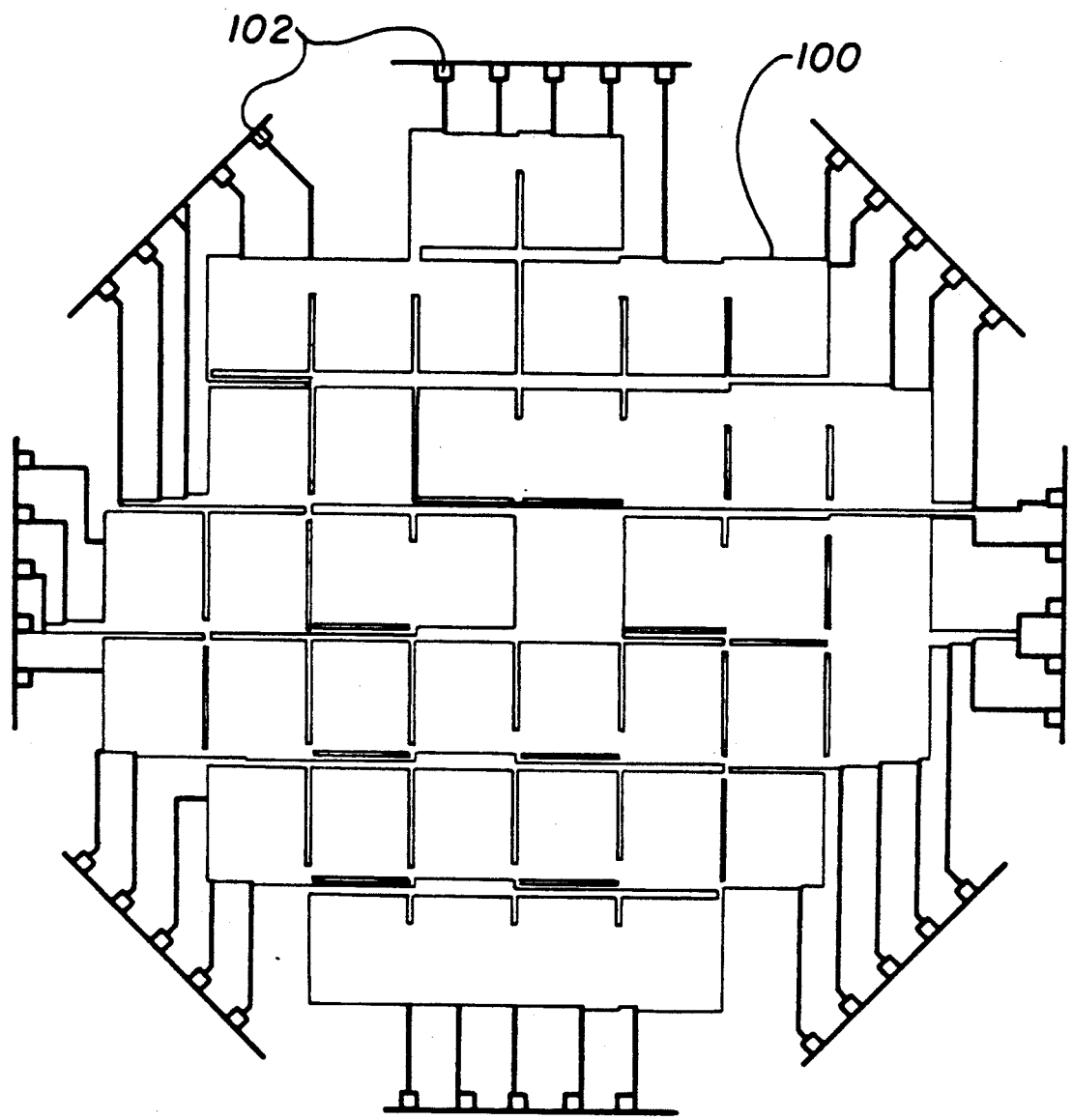
FIG. 6 is an elevational view of the second level of etching on the device interface board used with the test probe assembly of FIG. 3.
Figure 7:
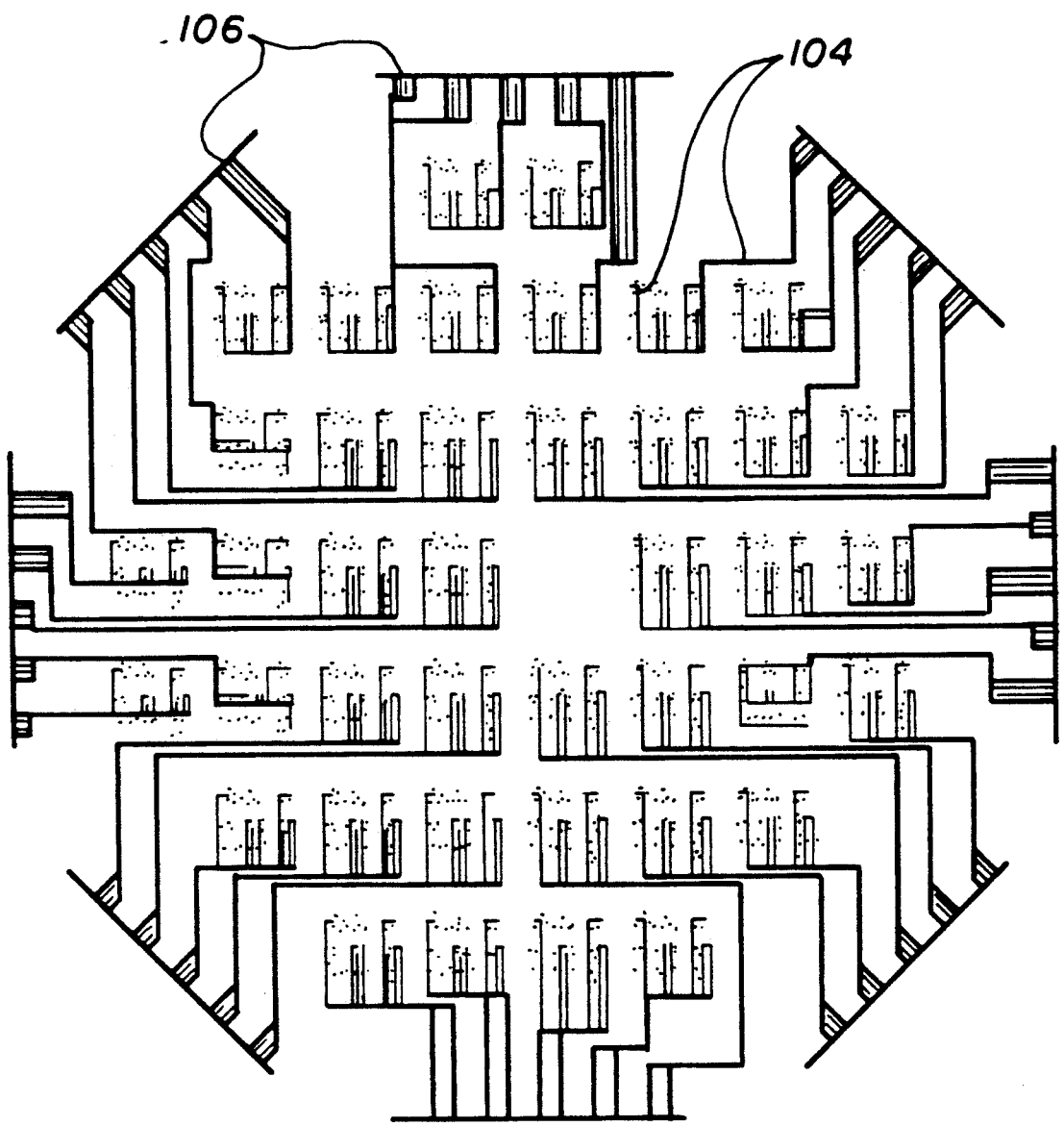
FIG. 7 is an elevational view of the third level of etching on the device interface board used with the test probe assembly of FIG. 3.

FIGS. 5 through 7 show patterns of traces formed onto various layers of the device interface board. As shown in these figures, the device interface board 94 is an octagonal-shaped silicon wafer onto which three layers of trace patterns are formed. FIG. 5 shows a pattern of ground level traces 96 which provide a ground connection between the plurality of probes 90 (FIG. 3) and the external test equipment. The ground level traces are brought to the perimeter of the device interface board 94 at connection points 98. The copper foil lines of the printed circuit board 92 are wire bonded to these connection points.

FIG. 6 shows a pattern of power level traces 100 which provide power from the external test equipment to the plurality of probes 90. The power level traces are also brought to the perimeter of the device interface board 94 at connection points 102 which are wire bonded to the copper foil lines on the printed circuit board 92. Similarly, FIG. 7 shows a pattern of signal level traces 104 which provide test signals to and from the test equipment to the plurality of probes. The signal level traces 104 are likewise brought to the perimeter of the device interface board 94 at connection points 106 which are in turn wire bonded to the copper foil lines on the printed circuit board. Thus, the resulting interconnection device 92 provides the means to carry signal, power, and ground connections from the external test equipment to the probes, and back to the test equipment.

Referring again back to FIG. 3, the upper guide element 84 and the lower guide element 86 permit precise alignment of the plurality of test probes 90 within the test probe assembly 14. The upper guide element is comprised of an upper layer 108 of FOTOFORM having an array of holes 110 etched therein joined to an upper layer of silicon 112 having a corresponding array of holes 114 etched therein. Similarly, the lower guide element 86 is comprised of a lower layer 116 of FOTOFORM having an array of holes 118 etched therein joined to a lower layer 120 of silicon having a corresponding array of holes 122 etched therein. The upper and lower guide elements are attached at their respective silicon layers by the spacers 88. Due to their small size, the spacers may be constructed from metal without adversely affecting the thermal expansion compatibility of the test wafer and the test probe assembly.

The upper and lower guide elements are formed in similar manners. Holes are etched into the upper and lower layers of silicon and the upper and lower layers of FOTOFORM before joining the layers of silicon to the layers of FOTOFORM. Because silicon tends to etch in preferred directions, the holes etched into the silicon are non-uniform in size and shape. These non-uniform holes lack the required precision to locate and guide the probes. Thus, the silicon layers are used to match the thermal expansion of coefficient of the test wafer, and the holes therein are formed sufficiently large enough to accommodate the probes, which are precisely aligned by the FOTOFORM arrays of holes. The silicon holes, then, are merely adapted to permit the plurality of probes 90 to pass unobstructed therethrough.

The holes in the upper and lower layers of FOTOFORM, on the other hand, are etched with precision, because FOTOFORM does not tend to etch in preferred directions. The FOTOFORM holes, then, are adapted to precisely align the plurality of probes in an intricate pattern which matches a pattern of test contact points on the surface of the test wafer. In the preferred embodiment of the present invention, the holes 110 in the upper layer 108 of FOTOFORM are about 0.015 inch in diameter and the holes 118 in the lower layer 116 are about 0.01 inch in diameter. Such small dimensions are required in order to accommodate a large number of probes, which in the described embodiment equals forty probes per integrated circuit chip on the test wafer.

A thin layer of metallic film is deposited onto the surface of each of the upper and lower layers of silicon which will be joined to the upper and lower layers, respectively, of FOTOFORM. Similarly, a thin layer of metallic film is deposited onto the surface of each of the upper and lower layers of FOTOFORM which will be joined to the upper and lower layers of silicon. The upper layer of FOTOFORM is then positioned adjacent to the upper layer of silicon so that the array of holes in these two layers are aligned. The adjacent layers are then heated to fuse the metal depositions together, thereby joining the layers. Similarly, the lower layer of FOTOFORM is positioned adjacent to the lower layer of silicon so that the arrays of holes are aligned. The adjacent layers are also heated to fuse the metal depositions on each of the layers together, thereby joining the layers.

Figure 8:
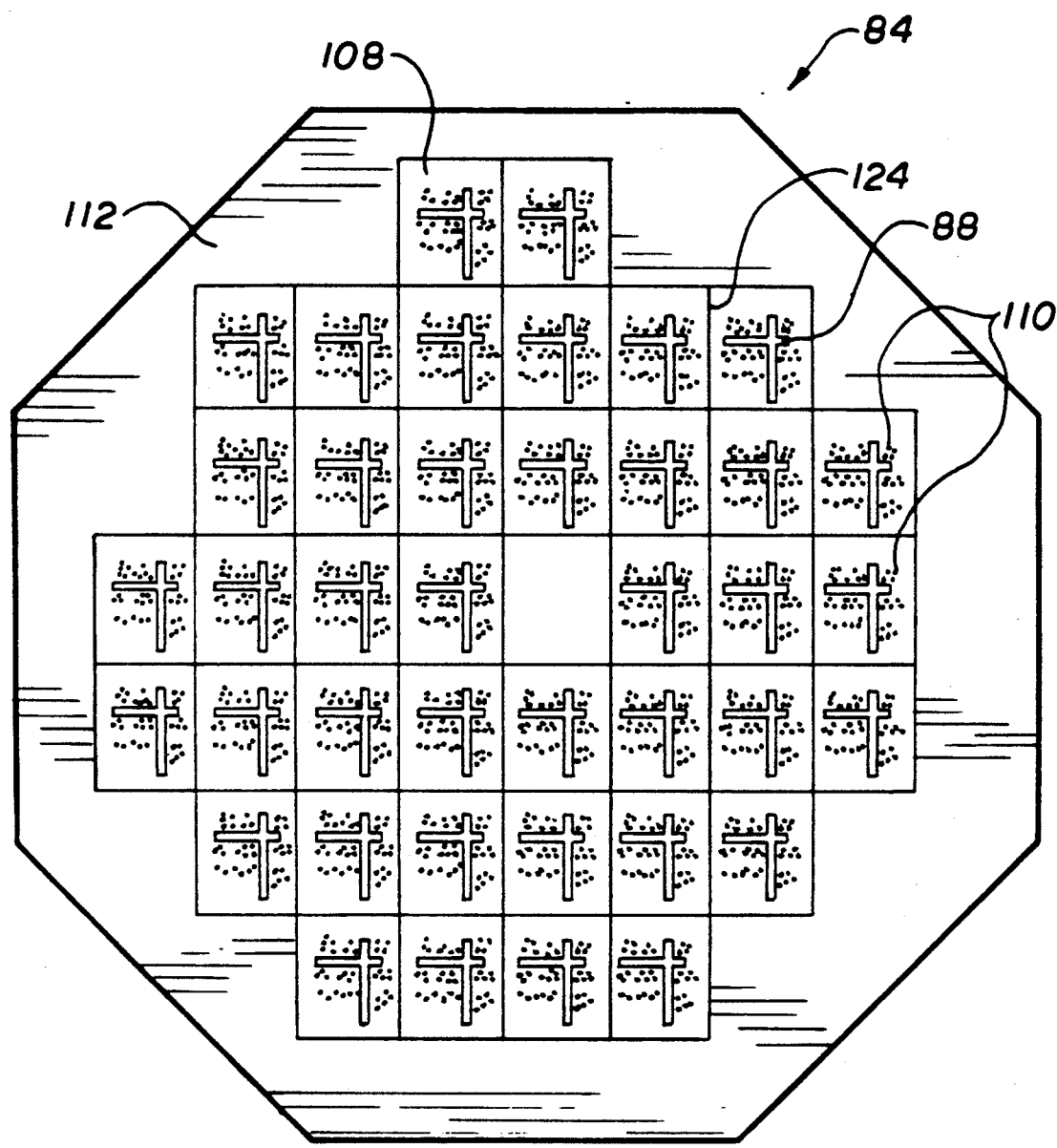
FIG. 8 is an elevational view of the upper guide element used with the test probe assembly of FIG. 3.

FIG. 8 shows the upper of the resulting upper and lower guide elements, although the lower guide element is similarly constructed. As shown in FIG. 8, the FOTOFORM layer 108 in the upper guide element is mechanically cut into a gridlike pattern 124, separating the layer into a plurality of generally rectangular blocks. The lower layer 116 of FOTOFORM is similarly cut into a plurality of generally rectangular blocks. Because FOTOFORM has a thermal expansion coefficient of about 9 ppm, which is different than that of silicon (2.6 ppm), the gridlike pattern of spaces between the blocks permits the FOTOFORM layers to expand and contract during heat testing without fracturing. If the FOTOFORM were constructed by a single large block and secured to the layer of silicon, the different thermal expansion coefficients of the two materials would cause the FOTOFORM to bow or fracture.

Also, if the FOTOFORM were constructed of a single large block secured to the layer of silicon, the FOTOFORM would expand differently than the test wafer, thereby causing misalignment of the probes with contacts on the test wafer, especially at the outer edges of the FOTOFORM block. However, by segmenting the FOTOFORM into the gridlike pattern of smaller blocks, each of the smaller blocks expands individually without interfering with the remaining blocks. This individual expansion eliminates or at least minimizes any misalignment of probes with contacts on the test wafer.

The probes 90 which are aligned by the upper and lower guide elements are preferably constructed from a metallic material offering good electrical conductivity, for example hardened beryllium copper. The probes are each comprised of a pair of telescopingly joined sections with a spring captured therebetween as is well known in the art. As shown in FIG. 3, each of the probes abuts the device interface board at a first end 126. This first end of the probe is wider 0.015 inch) than a second end 128 of the probe 0.01 inch) in the preferred embodiment, and extends through holes 110 and 114 in the upper guide element 84. The second end 128 of each of the probes extends through holes 118, 122 in the lower guide element 86, culminating in a foot pad 132 which is adapted to contact test points on the wafer being tested. A flange 130, approximately 0.019 inch in diameter, on each of the probes abuts the lower silicon layer 120 of the lower guide element 86 to secure the probe within the test probe assembly 14.

Accordingly, a test apparatus, a test probe assembly for use with the apparatus, and a method of forming the test probe assembly according to the present invention have been described in their preferred form. However, with the present disclosure in mind, it is believed that obvious alternatives to the preferred embodiment, to achieve comparable advantages in other test apparatuses, will become apparent to those of ordinary skill in the art.

What is claimed is:

1. A test apparatus for testing over a range of temperatures electronic integrated circuits residing on a test wafer, comprising:
   a probe assembly for transmitting test signals to test contacts on the circuits residing on the test wafer, said probe assembly comprising upper and lower guide elements spaced apart from and in fixed relationship to each other, each of said guide elements having a plurality of holes therein and comprising a layer of silicon adjacent to a layer of electrically insulating, photolithographically patternable material, and a plurality of probes extending through and beyond said plurality of holes in each of said guide elements, each probe in said plurality having a first end connected with a source of test signals and a second end adapted to contact the test contacts on the test wafer, each of said layers of photolithographically patternable material having an inner surface facing one of said layers of silicon, each of said layers of silicon having an inner surface facing one of said layers of photolithographically patternable material, the adjacent layers of silicon and photolithographically patternable material in each of the upper and lower guide elements being joined by fused layers of metal deposition deposited on each of said inner surfaces of photolithographically patternable material and each of said inner surfaces of silicon;
   an alignment mechanism for aligning said probe assembly with the test contacts;
   a securing mechanism for securing the position of said test wafer with respect to said probe assembly when said probe assembly and the test contacts are aligned; and
   a contacting mechanism for contacting said second ends of said probes with the test contacts.

2. The test apparatus of claim 11, further comprising a heater element for heating the integrated circuits residing on the test wafer.

3. The test apparatus of claim 2, wherein said heater element comprises a metal trace on a surface of a silicon substrate, said metal trace connectable to an electric current to heat said test wafer, and wherein said heater element further comprises a sensor for sensing temperature at the surface of the substrate.

4. The test apparatus of claim 2, wherein said contacting mechanism comprises an upper chuck to which said probe assembly is mounted, said upper chuck being movable toward and away from said heater element.

5. The test apparatus of claim 4, further comprising means to control the pressure at which the second ends of said plurality of probes is applied to the test contacts on the circuits residing on the test wafer.

6. The test apparatus of claim 2, wherein said alignment mechanism comprises a manually adjustable platform and a visual indicator for indicating the precise alignment of the probe assembly with the test contacts on the circuits residing on the test wafer.

7. The test apparatus of claim 2, wherein said securing mechanism comprises at least one vacuum line connected to said heater element.

8. The test apparatus of claim 1, wherein said upper and lower guide element layers of photolithographically patternable material have cut therethrough a gridlike pattern of grooves separating each of said layers into a plurality of individual blocks.

9. The test apparatus of claim 3, wherein said upper guide element layer of silicon, said lower guide element layer of silicon, and said heater element, and said heater element silicon substrate are all obtained from the same batch process as that used to obtain silicon used to manufacture the test wafer.

10. The test apparatus of claim 1, wherein said holes in said upper guide element photolithographically patternable material layer are about 0.015 inch in diameter and wherein said holes in said lower guide element photolithographically patternable material are about 0.01 inch in diameter.

11. A test probe assembly for testing electronic integrated circuitry over a range of temperatures, comprising:
   a device interface board connectable to a source of test signals for transmitting test signals to and from the source;
   a probe guide comprising an upper guide element, a lower guide element and at least one spacer member for maintaining the upper guide element spaced apart from and in fixed relationship to the lower guide element, said upper and lower guide elements having a plurality of aligned holes therein, said aligned upper and lower guide elements each comprising a layer of silicon adjacent to a layer of electrically insulating, photolithographically patternable material, each of said layers of photolithographically patternable material having an inner surface facing one of said layers of silicon, each of said layers of silicon having an inner surface facing one of said layers of photolithographically patternable material, the adjacent layers of silicon and photolithographically patternable material in each of the upper and lower guide elements being joined by fused layers of metal deposited on each of said inner surfaces of photolithographically patternable material and each of said inner surfaces of silicon; and
   a plurality of probes, each probe having one end abutting said device interface board and having another end for contacting test points on electronic integrated circuitry to be tested, each of said plurality of probes extending completely through said holes in said upper and lower guide elements.

12. The test probe assembly of claim 11, further comprising a heater element for applying heat to the electronic integrated circuitry being tested.

13. The test probe assembly of claim 12, wherein said heater element comprises a metal trace on a surface of a silicon substrate, said metal trace connectable to an electric current to heat said wafer, and wherein said heater element further comprises a sensor for sensing temperature at the surface of the substrate.

14. The test probe assembly of claim 12, further comprising an attachment mechanism for attaching the circuitry to be tested to said heater element.

15. The test probe assembly of claim 14, wherein said attachment mechanism comprises at least one vacuum line connected to said heater element.

16. The test probe assembly of claim 11, wherein said spacer member is constructed from a metallic material.

17. The test probe assembly of claim 11, wherein said upper and lower guide element layers of photolithographically patternable material have cut therethrough a grid-like pattern of grooves separating each of said layers into a plurality of individual blocks.

18. The test probe assembly of claim 17, wherein said device interface board comprises a silicon wafer having a multi-level pattern of etched circuit lines, and a printed circuit board having printed circuit lines connectable to the source of test signals, said printed circuit board attached to said silicon wafer so that said printed circuit lines on the printed circuit board are connected with said etched circuit lines on the silicon wafer.

19. The test probe assembly of claim 18, wherein said printed circuit lines on the printed circuit board are wire bonded with said etched circuit lines on the silicon wafer.

20. The test probe assembly of claim 12, wherein said upper guide element layer of silicon, said lower guide element layer of silicon, and said heater element silicon substrate are all obtained from the same batch process as that used to obtain silicon used in the electronic integrated circuitry being tested.

21. The test probe assembly of claim 11, wherein said holes in said upper guide element photolithographically patternable material layers are about 0.015 inch in diameter and wherein said holes in said lower guide element photolithographically patternable material layer are about 0.01 inch in diameter.

22. A method of forming a test probe assembly for environmentally testing electronic circuitry, comprising the steps of:

providing first and second layers of silicon having an array of chemically etched holes therein;

providing first and second layers of photolithographically patternable material having an array of chemically etched holes therein, said photolithographically patternable material array of holes having a similar pattern to said silicon array of holes;

depositing a thin metallic film onto one side of each of said first and second layers of silicon;

depositing a thin metallic film onto one side of each of said first and second layers of photolithographically patternable material;

positioning said first layer of silicon with respect to said first layer of photolithographically patternable material so that said arrays of holes in each of said first layers are aligned and so that said thin metallic films deposited onto each of said first layers face each other;

positioning said second layer of silicon with respect to said second layer of photolithographically patternable material so that said arrays of holes in each of said second layers are aligned and so that said thin metallic films deposited onto each of said second layers face each other;

heat treating said positioned first layers and said positioned second layers so that said facing thin metallic films fuse to form a metallic bond;

attaching said first layer of silicon to said second layer of silicon with at least one spacer to maintain said first layer of silicon spaced apart from and in fixed relationship to said second layer of silicon;

providing a device interface board which is connectable to the apparatus for testing electronic circuitry and which carries test signals outputted by the apparatus;

attaching a plurality of test probes to said device interface board, each of said test probes having a length greater than the combined widths of said spacer, said first and second photolithographically patternable material layers, and said first and second silicon layers; and inserting said extending test probes through said aligned arrays of holes in said positioned first layers and said positioned second layers to complete said test probe assembly.

23. The method of claim 22, further comprising the steps of:

providing a heater element for applying heat to the electronic circuitry to be tested, providing a sensor for sensing the temperature of said heater element; and providing an attachment mechanism for attaching the circuitry to be tested with said heater element.

24. The method of claim 23, further comprising the step of providing a vacuum line for attaching said heater element to said electronic circuitry.

* * * * *

UNITED STATES PATENT AND TRADEMARK OFFICE
CERTIFICATE OF CORRECTION

PATENT NO. : 5,210,485
DATED : May 11, 1993
INVENTOR(S) : Kreiger, et al

It is certified that error appears in the above-indentified patent and that said Letters Patent is hereby corrected as shown below:

Column 9, line 52, change "11" to --1--.

Signed and Sealed this

Tenth Day of May, 1994

Attest:

BRUCE LEHMAN

*Attesting Officer*        *Commissioner of Patents and Trademarks*